(12) United States Patent
Fukuzaki et al.

(10) Patent No.: US 10,373,976 B2
(45) Date of Patent: Aug. 6, 2019

(54) SEMICONDUCTOR DEVICE

(71) Applicant: Sony Corporation, Tokyo (JP)

(72) Inventors: Yuzo Fukuzaki, Kanagawa (JP); Hiroaki Ammo, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 241 days.

(21) Appl. No.: 14/310,689

(22) Filed: Jun. 20, 2014

(65) Prior Publication Data

US 2015/0008525 A1 Jan. 8, 2015

(30) Foreign Application Priority Data

Jul. 5, 2013 (JP) .................................. 2013-141746

(51) Int. Cl.
| | | |
|---|---|---|
| *H01L 27/12* | (2006.01) | |
| *H01L 29/861* | (2006.01) | |
| *H01L 27/02* | (2006.01) | |
| *H01L 29/78* | (2006.01) | |
| *H01L 29/786* | (2006.01) | |
| *H01L 23/528* | (2006.01) | |
| *H01L 23/367* | (2006.01) | |

(52) U.S. Cl.
CPC ........ *H01L 27/1203* (2013.01); *H01L 23/367* (2013.01); *H01L 23/3677* (2013.01); *H01L 23/528* (2013.01); *H01L 27/0251* (2013.01); *H01L 27/1211* (2013.01); *H01L 29/785* (2013.01); *H01L 29/78651* (2013.01); *H01L 29/8611* (2013.01); H01L 27/0207 (2013.01); H01L 2924/0002 (2013.01)

(58) Field of Classification Search
CPC .............. H01L 27/088; H01L 27/1203; H01L 27/0207; H01L 27/0248; H01L 27/0251; H01L 2224/30519; H01L 23/3677; H01L 23/367; H01L 27/1207; H01L 21/76264–76291; H01L 2224/33519; H01L 2224/49568; H01L 23/34–38; H01L 23/522–53295
See application file for complete search history.

(56) References Cited

U.S. PATENT DOCUMENTS

| 8,048,753 B2* | 11/2011 | Zhou ....................... H01L 21/84 |
| | | 257/E21.042 |
| 2009/0010064 A1* | 1/2009 | Nazarian ............ G11C 16/0483 |
| | | 365/185.17 |
| 2012/0129301 A1* | 5/2012 | Or-Bach .................. G11C 8/16 |
| | | 438/129 |
| 2013/0227268 A1* | 8/2013 | Ichida ................... G06F 9/4421 |
| | | 713/100 |

* cited by examiner

*Primary Examiner* — Lauren R Bell
(74) *Attorney, Agent, or Firm* — Dentons US LLP

(57) ABSTRACT

A semiconductor device includes: a substrate; an insulator layer provided on the substrate; a first transistor provided on the insulator layer; a semiconductor layer including a plurality of impurity regions of a first conduction type, the impurity regions forming a part of the first transistor; a heat dissipation layer; a thermal conductive layer linking the semiconductor layer and the heat dissipation layer; and an interruption structure configured to interrupt a flow of a current between the first transistor and the thermal conductive layer.

11 Claims, 16 Drawing Sheets

SEMICONDUCTOR DEVICE

CROSS REFERENCE TO RELATED APPLICATIONS

This application claims the benefit of Japanese Priority Patent Application JP2013-141746 filed Jul. 5, 2013, the entire contents of which are incorporated herein by reference.

BACKGROUND

The present disclosure relates to a semiconductor device having a structure in which an insulator layer and a semiconductor layer are laminated on a semiconductor substrate.

For semiconductor integrated circuits including a complementary metal oxide semiconductor (CMOS) transistor, it has been studied to achieve high integration and a high operating speed. In recent years, development of CMOS large-scale integrated circuits (CMOS-LSIs) having a silicon-on-insulator (SOI) structure of low power consumption and a high operating speed has been in progress.

In a CMOS-LSI, a large amount of heat is generated, in particular, in an active region of a metal-oxide-semiconductor field-effect transistor (MOSFET). This amount of generated heat may reach tens of watts, and the temperature of the CMOS-LSI may increase from tens of degrees Celsius to nearly one hundred degrees Celsius, in some cases. Such an increase in temperature may bring disadvantages due to a self-heating effect. Examples of such disadvantages may include a disadvantage of a reduction in an ON-state current of the MOSFET due to a decrease in mobility of a carrier, and a disadvantage of an increase in propagation delay by metal wiring due to an increase in resistance value of the metal wiring. In this regard, in an ordinary CMOS-LSI not having the SOI structure, heat generated in an active region of a MOSFET is immediately dissipated from a package containing a semiconductor chip, mainly through a semiconductor substrate having high thermal conductivity (for example, a silicon substrate). In contrast, in the CMOS-LSI having the SOI structure, the heat generated in the active region of the MOSFET is not easily released to outside, because an insulator layer having low thermal conductivity (for example, a silicon oxide layer) is present between the active region of the MOSFET and a semiconductor substrate. Therefore, the above-described disadvantages are easily invited.

Thus, there has been disclosed a technique of securing a heat dissipation path by, for example, allowing one end of a contact plug connected to a diffusion layer to pass through a silicon oxide film, to be brought into contact with a silicon substrate (for example, see Japanese Unexamined Patent Application Publication No. H11-135799).

SUMMARY

However, in JPH11-135799A, structurally, an electric potential on the substrate side is fixed to Vdd or GND. For this reason, it is difficult to achieve high-speed operation and power consumption reduction utilizing a substrate bias effect. Specifically, for example, it is difficult to increase an operating speed by lowering a threshold voltage Vth by forward biasing the substrate during operation, and to reduce a current leakage by back biasing the substrate during standby.

It is desirable to provide a semiconductor device superior in terms of heat dissipation and operating speed, in a simple configuration.

According to an embodiment of the present disclosure, there is provided a semiconductor device including: a substrate; an insulator layer provided on the substrate; a first transistor provided on the insulator layer; a semiconductor layer including a plurality of impurity regions of a first conduction type, the impurity regions forming a part of the first transistor; a heat dissipation layer; a thermal conductive layer linking the semiconductor layer and the heat dissipation layer; and an interruption structure configured to interrupt a flow of a current between the first transistor and the thermal conductive layer.

In the semiconductor device according to the above-described embodiment of the present disclosure, heat generated by driving the first transistor travels to the heat dissipation layer through the thermal conductive layer and is then released to outside. In addition, the flow of the current between the first transistor and the thermal conductive layer is interrupted by the interruption structure and therefore, it is possible to set an electric potential of the substrate arbitrarily.

According to the semiconductor device of the above-described embodiment of the present disclosure, high-speed operation and power consumption reduction utilizing a substrate bias effect are achievable in a simple configuration, while ensuring high heat dissipation.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the present disclosure, and are incorporated in and constitute a part of this specification. The drawings illustrate embodiments and, together with the specification, serve to describe the principles of the technology.

DETAILED DESCRIPTION

Some embodiments of the present disclosure will be described below with reference to the drawings. It is to be noted the description will be provided in the following order.

1. First Embodiment and Modification Thereof

A semiconductor device in which a second transistor serving as an interruption structure and a substrate serving as a heat dissipation layer are connected by a thermal conductive layer in a region except an overlap region between the substrate and a semiconductor layer. A semiconductor device serving a modification in which the semiconductor layer is shaped like a fin.

2. Second Embodiment and Modification Thereof

A semiconductor device in which a semiconductor layer and a substrate are connected by a thermal conductive layer passing through an insulator layer. A semiconductor device serving a modification in which the semiconductor layer is shaped like a fin.

3. Third Embodiment and Modification Thereof

A semiconductor device in which a metal layer is provided as a heat dissipation layer, separately from a substrate. A semiconductor device serving a modification in which the semiconductor layer is shaped like a fin.

4. Fourth Embodiment

A semiconductor device in which a semiconductor layer includes an impurity region of a first conduction type and an impurity region of a second conduction type.

First Embodiment

[Configuration of Semiconductor Device 1]

Figure 1A:
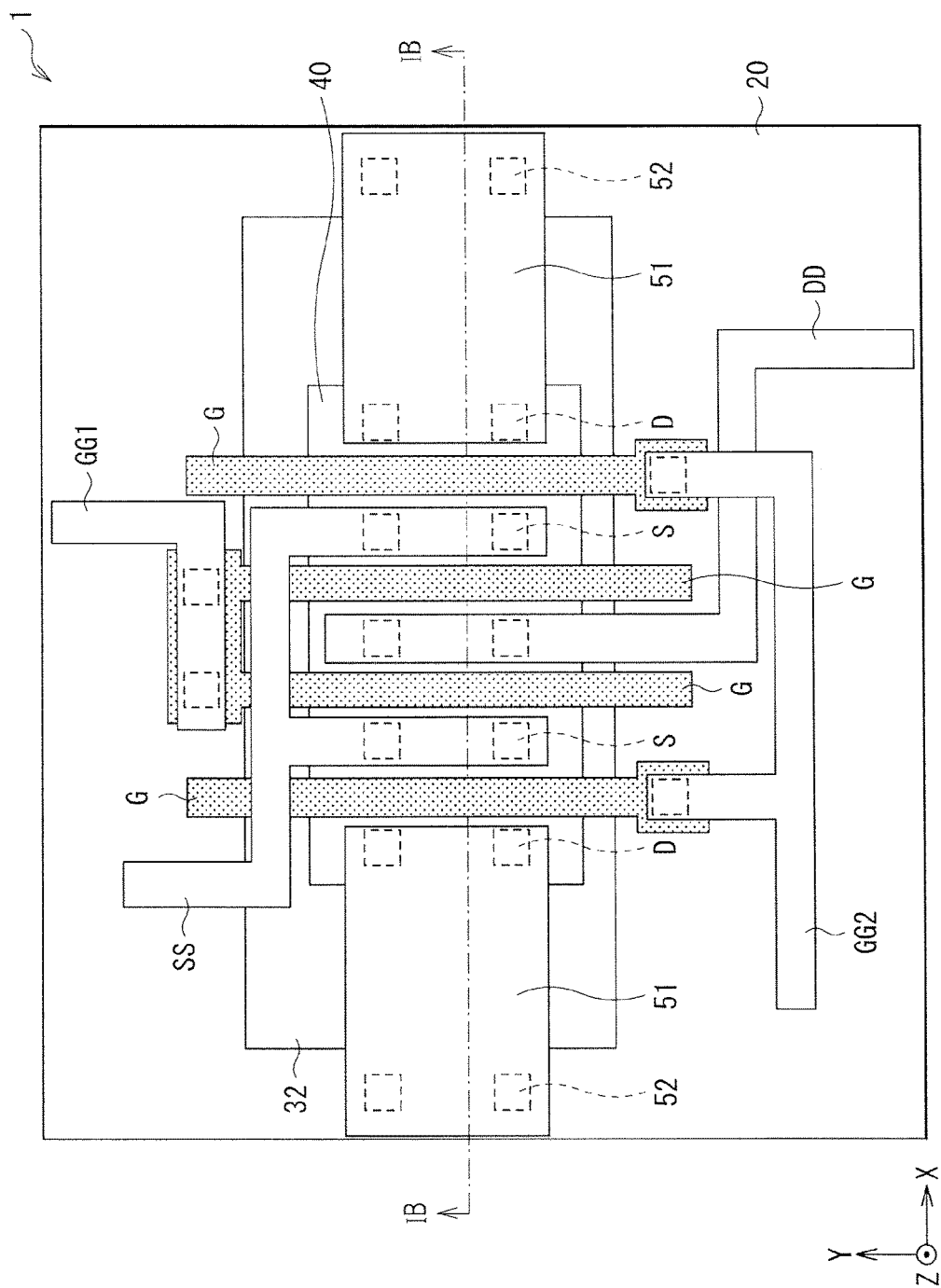
FIG. 1A is a plan view illustrating a configuration example of a semiconductor device according to a first embodiment of the present disclosure.
Figure 1B:
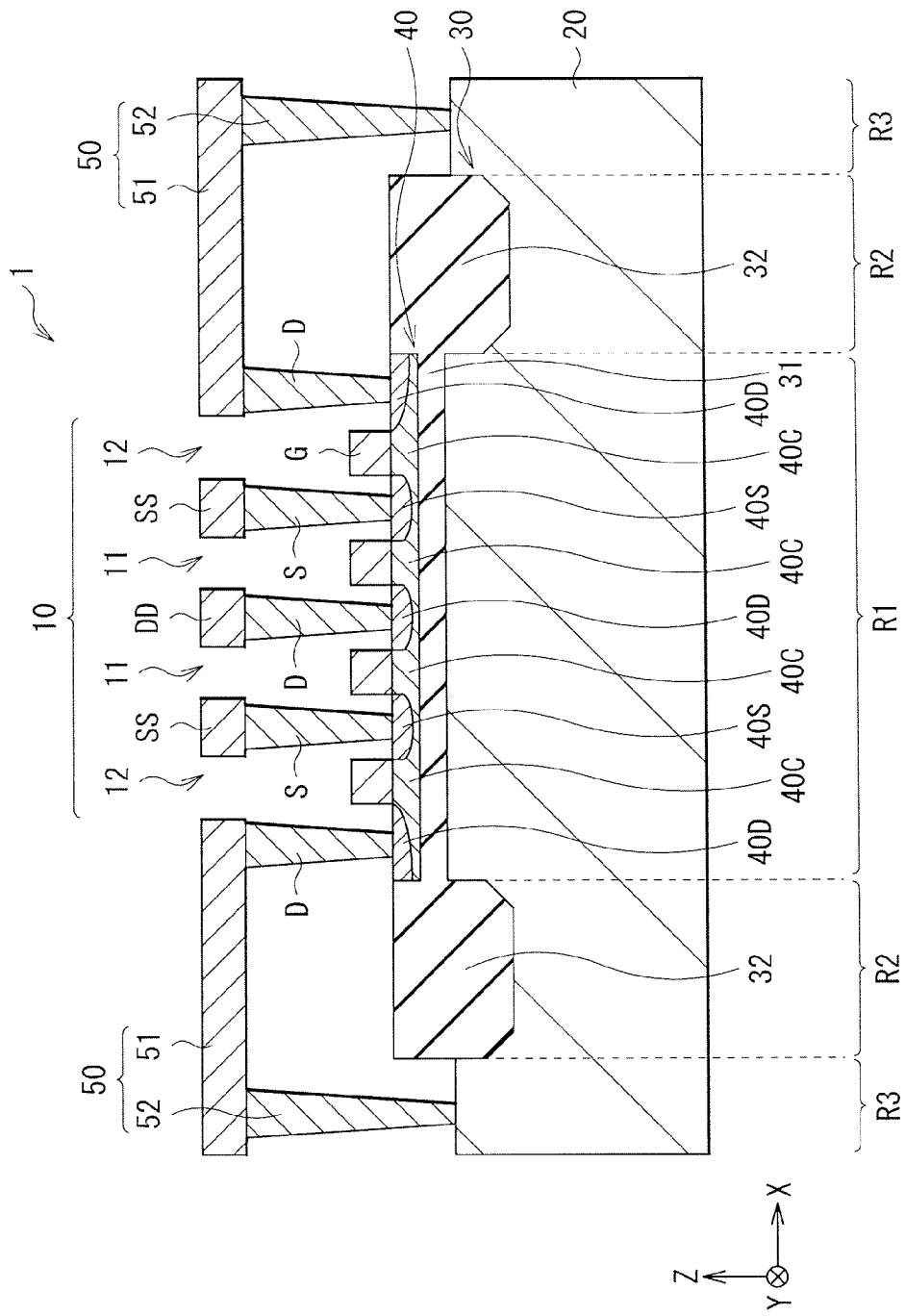
FIG. 1B is a cross-sectional diagram of the semiconductor device illustrated in FIG. 1A.

FIG. 1A illustrates a plane configuration of a semiconductor device 1 according to a first embodiment of the present disclosure. FIG. 1B illustrates a cross-sectional configuration of the semiconductor device 1. FIG. 1B corresponds to a cross-sectional diagram taken along a cutting plane line IB-IB illustrated in FIG. 1A, and viewed in an arrow direction.

The semiconductor device 1 may include, for example, a plurality of semiconductor elements 10 provided on a substrate 20 common thereto. However, in FIGS. 1A and 1B, a case of providing only one of the semiconductor elements 10 is illustrated as an example. The substrate 20 may be, for example, a silicon substrate. The semiconductor device 1 includes an element formation region R1, an element separation region R2, and a bulk region R3. The element formation region R1 serves as an active region where the semiconductor element 10 is provided. The element separation region R2 surrounds the element formation region R1, for each of the semiconductor elements 10. The bulk region R3 is a region except the element formation region R1 and the element separation region R2.

In the element formation region R1, a so-called fully depleted SOI structure is formed. In this structure, an insulator layer 30 and a semiconductor layer 40 are laminated in this order on the substrate 20.

The insulator layer 30 may be made of, for example, a material such as a silicon oxide film, and may include, for example, an embedded oxide film (BOX) 31 and an element separation section 32. The embedded oxide film 31 is embedded in the element formation region R1. The element separation section 32 is provided in the element separation region R2 and has a thickness larger than a thickness of the embedded oxide film 31. The thickness of the embedded oxide film 31 may be, for example, 20 nm.

The semiconductor layer 40 may be, for example, an element formation section made of a silicon thin film and having a thickness of 10 nm. The semiconductor layer 40 is provided only in the element formation region R1, and forms a part of each of a first MOSFET 11 and a second MOSFET 12. Specifically, for example, the two first MOSFETs 11 and the two second MOSFETs 12 may be provided on the insulator layer 30. The two first MOSFETs 11 are aligned in an X-axis direction, and the two second MOSFETs 12 are disposed to sandwich the first MOSFETs 11 in the X-axis direction. The first MOSFET 11 and the second MOSFET 12 may be of either an n-type or a p-type, but are of the same conduction type. Further, the number of the first MOSFETs 11 may be one, or three or more.

The semiconductor layer 40 may be, for example, a layer in which a plurality of impurity regions (a source region 40S and a drain region 40D) and a plurality of channel regions 40C are arranged alternately in, for example, the X-axis direction. The impurity regions and the channel regions 40C may be formed by diffusing an impurity in a predetermined region of the silicon thin film. Each of the channel region 40C, the source region 40S, and the drain region 40D extends in a Y-axis direction. Further, a gate electrode G is provided on the channel region 40C of the semiconductor layer 40, with a not-illustrated gate insulating film interposed therebetween.

The first MOSFET 11 and the second MOSFET 12 each include a source electrode S and a drain electrode D connected to the source region 40S and the drain region 40D, respectively. Further, the first MOSFET 11 and the second MOSFET 12 each include the gate electrode G provided in the channel region 40C, with the gate insulating film interposed therebetween. The source electrode S and the drain electrode D extend in a thickness direction (a Z-axis direction), and the gate electrode G extends in the Y-axis direction. The gate electrode G, the source electrode S, and the drain electrode D may be all configured using, for example, a material having high thermal conductivity, such as Cu (copper). Here, the two first MOSFETs 11 may share, for example, the one drain electrode D. The drain electrode D in the first MOSFET 11 is connected to a wiring pattern DD spreading in an XY plane, at an upper end of the drain electrode D. Further, the first MOSFET 11 and the second MOSFET 12 next to each other share the one source electrode S. All the source electrodes S are connected to a common wiring pattern SS spreading in the XY plane, at upper ends of the source electrodes S. Furthermore, of the source electrodes S and the drain electrodes D in the element formation region R1, the two drain electrodes D in the respective second MOSFETs 12 located at both ends are connected to a thermal conductive layer 50 to be described later. It is to be noted that an arrangement relation between the source electrode S and the drain electrode D may be the reverse of the arrangement relation illustrated in FIGS. 1A and 1B. Further, the gate electrode G in the first MOSFET 11 is connected to a common wiring pattern GG1 spreading in the XY plane, at an upper end of the gate electrode G. On the other hand, the gate electrode G in the second MOSFET 12 is connected to a common wiring pattern GG2 spreading in the XY plane, an upper end of the gate electrode G. Therefore, the gate electrode G in the second MOSFET 12 and the gate electrode G in the first MOSFET 11 are allowed to be at different potentials.

The substrate 20 also serves as a heat dissipation layer. The substrate 20 is connected to the semiconductor layer 40 by the thermal conductive layer 50, in a region except a region where the semiconductor layer 40 overlaps the substrate 20, i.e., in the bulk region R3. To be more specific, the thermal conductive layer 50 is connected to the drain region 40D in the second MOSFET 12, of the semiconductor layer 40. The thermal conductive layer 50 includes a wiring layer 51, a plug 52, and the two drain electrodes D in the second MOSFET 12. The wiring layer 51 spreads in a laminated surface (the XY plane), and the plug 52 extends in the thickness direction (the Z-axis direction). The thermal conductive layer 50 serves as a heat dissipation path that allows heat to travel from the semiconductor layer 40 to the substrate 20 of the bulk region R3. It is to be noted that, the wiring layer 51 and the plug 52 each may be configured using, for example, a material having high thermal conductivity such as Cu, as with the source electrode S and the drain electrode D.

The second MOSFET 12 also serves as an interruption structure that interrupts a flow of a current between the first MOSFET 11 and the thermal conductive layer 50, while the first MOSFET 11 serves as a heat dissipation path used to release heat generated during operation thereof. This is because an electric potential causing the second MOSFET 12 to be in an OFF state is applied to the gate electrode G in the second MOSFET 12. Therefore, an electric potential of the semiconductor layer 40 does not affect an electric potential of the substrate 20.

Next, a method of manufacturing of the semiconductor device 1 will be described with reference to FIGS. 2A to 2N.

Figure 2A:
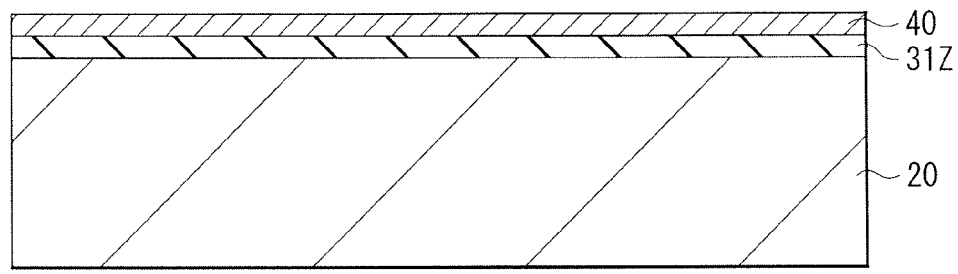
FIG. 2A is a cross-sectional diagram illustrating a process in a method of manufacturing of the semiconductor device illustrated in FIG. 1A.

First, a wafer WF is prepared, as illustrated in FIG. 2A. In the wafer WF, an insulator film 31Z and the semiconductor layer 40 are provided on the substrate 20. The insulator film 31Z later becomes the embedded oxide film 31.

Figure 2B:
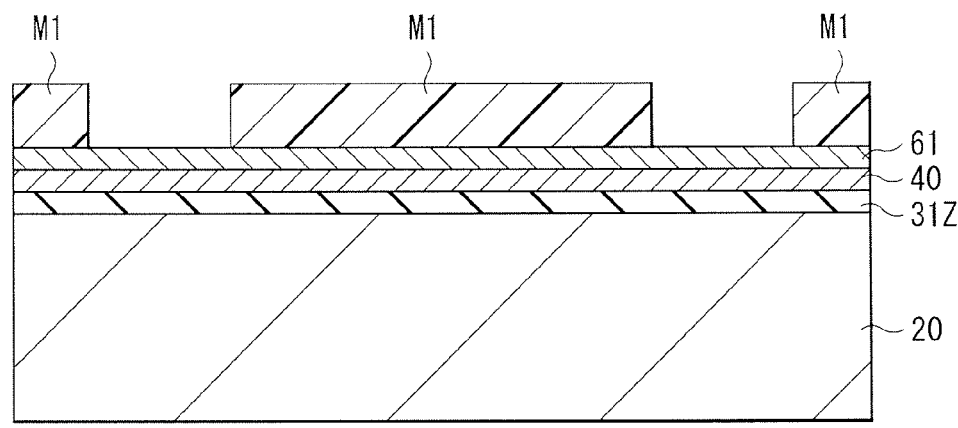
FIG. 2B is a cross-sectional diagram illustrating a process following the process in FIG. 2A.
Figure 2C:
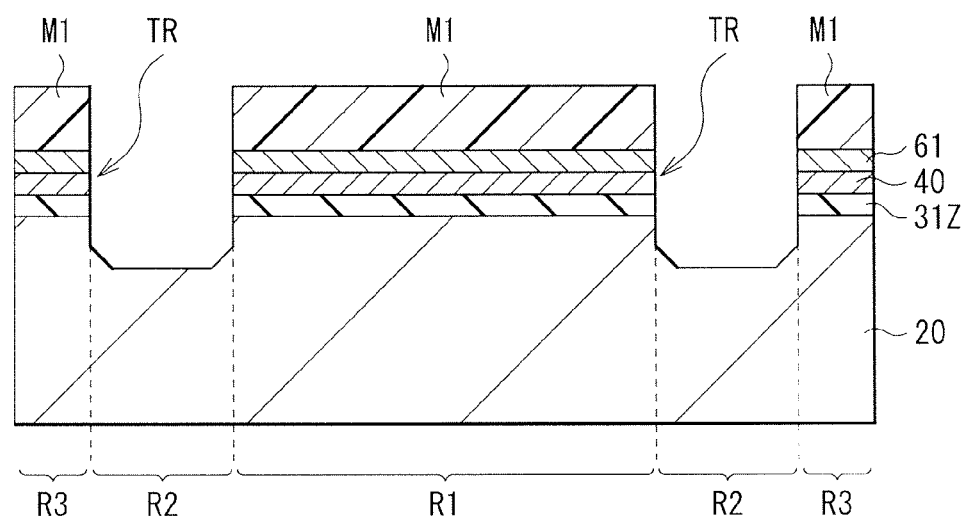
FIG. 2C is a cross-sectional diagram illustrating a process following the process in FIG. 2B.

Next, as illustrated in FIG. 2B, a SiN film 61 is formed on the entire surface, and then a photoresist mask M1 is formed to cover only the element formation region R1 and the bulk region R3 selectively. Subsequently, as illustrated in FIG. 2C, a trench TR is formed by removing all of the SiN film 61, the semiconductor layer 40, and the insulator film 31Z in the element separation region R2 not covered by the photoresist mask M1, as well as a part of the substrate 20, by etching.

Figure 2D:
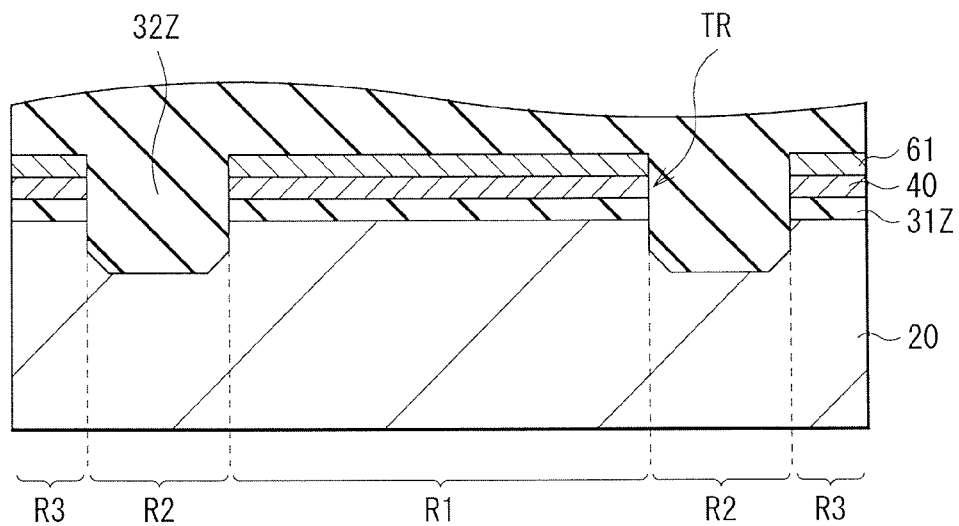
FIG. 2D is a cross-sectional diagram illustrating a process following the process in FIG. 2C.
Figure 2E:
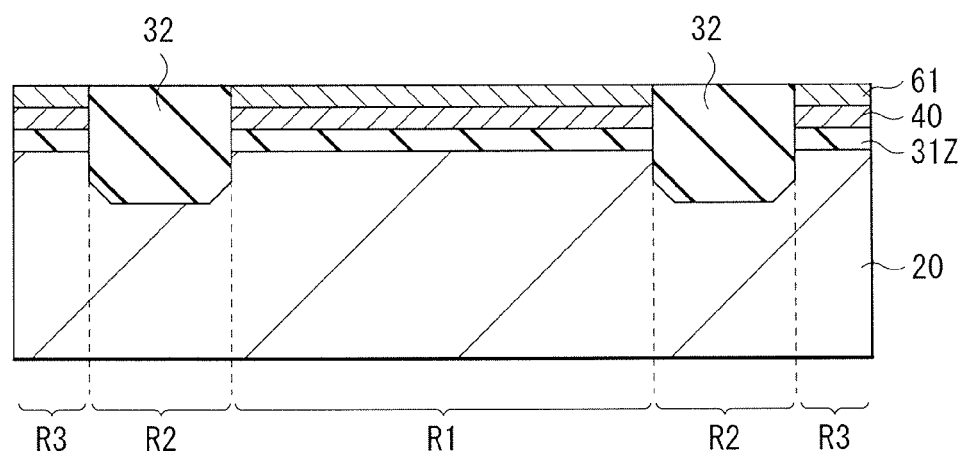
FIG. 2E is a cross-sectional diagram illustrating a process following the process in FIG. 2D.
Figure 2F:
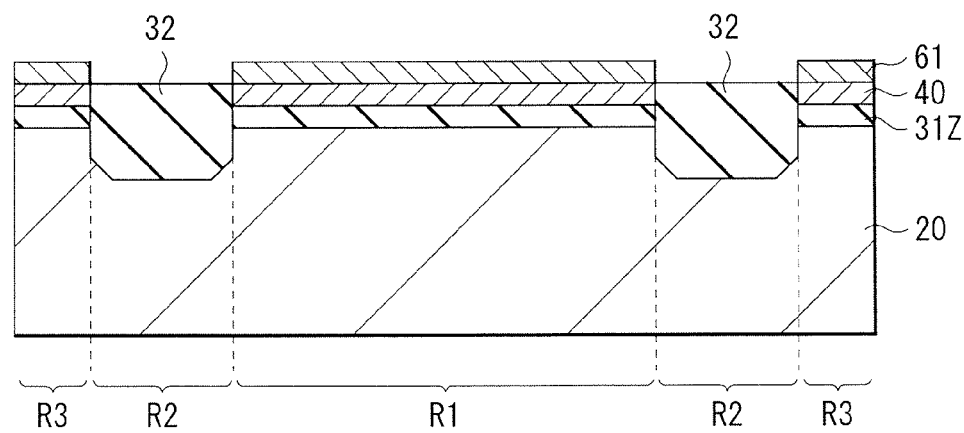
FIG. 2F is a cross-sectional diagram illustrating a process following the process in FIG. 2E.

Next, as illustrated in FIG. 2D, an insulator film 32Z is formed to cover the whole. In this process, the trench TR is completely filled with the insulator film 32Z. Subsequently, the entire surface is flattened by CMP processing, until the SiN film 61 is exposed (FIG. 2E). As a result, the element separation section 32 appears. Further, an upper layer part of the element separation section 32 is removed to be flush with a top surface of the semiconductor layer 40 (FIG. 2F).

Figure 2G:
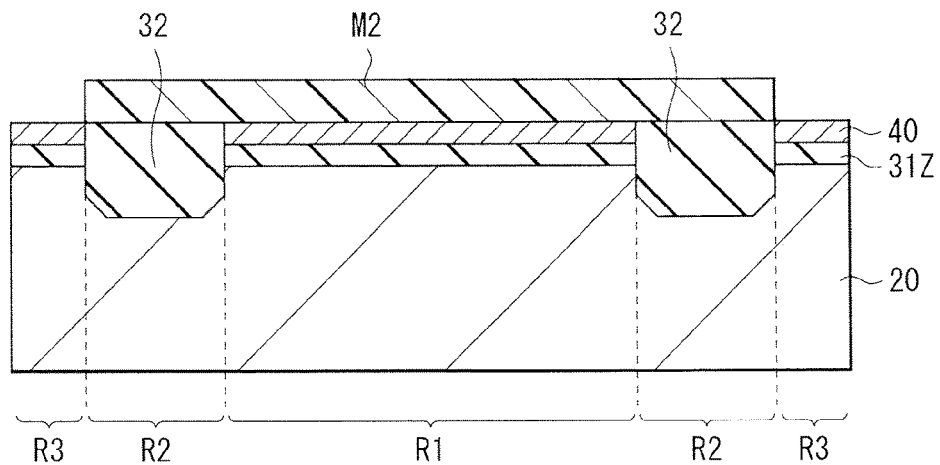
FIG. 2G is a cross-sectional diagram illustrating a process following the process in FIG. 2F.
Figure 2H:
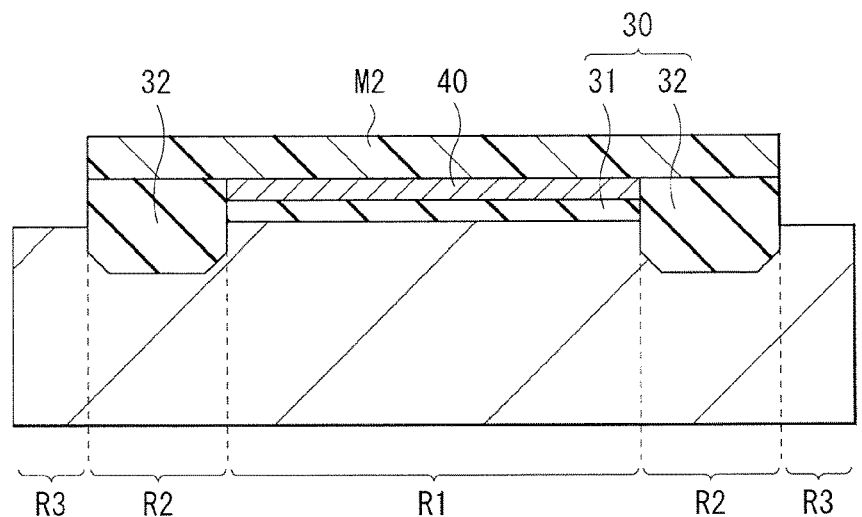
FIG. 2H is a cross-sectional diagram illustrating a process following the process in FIG. 2G.

Next, the SiN film 61 is removed to form a gate insulating film (not illustrated) selectively on the channel region 40C of the semiconductor layer 40. Subsequently, as illustrated in FIG. 2G, a photoresist mask M2 is selectively formed to cover a region except the bulk region R3, i.e., the element formation region R1 and the element separation region R2. Next, as illustrated in FIG. 2H, the semiconductor layer 40 and the insulator film 31Z in the bulk region R3 not covered by the photoresist mask M2 are removed to expose the substrate 20. The semiconductor layer 40 then appears in the element formation region R1, by lifting off the photoresist mask M2.

Figure 2I:
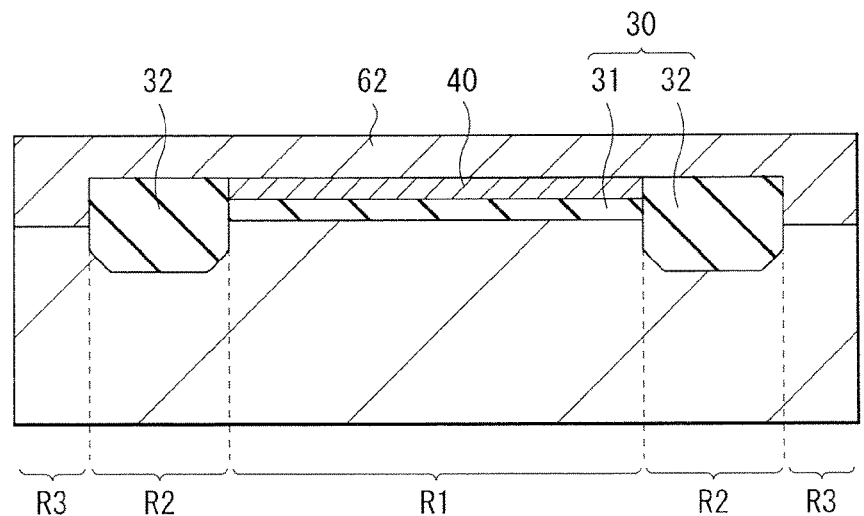
FIG. 2I is a cross-sectional diagram illustrating a process following the process in FIG. 2H.
Figure 2J:
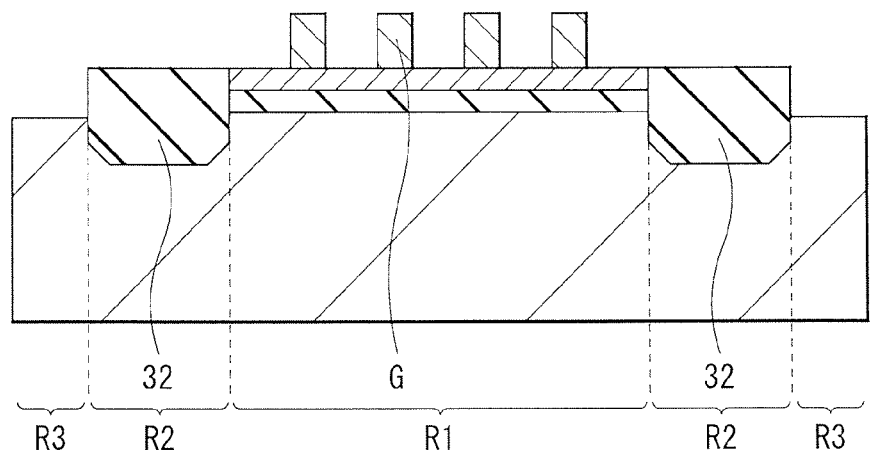
FIG. 2J is a cross-sectional diagram illustrating a process following the process in FIG. 2I.

Further, as illustrated in FIG. 2I, a metal layer 62 is formed to cover the whole. The metal layer 62 is then patterned using a photolithographic method, to form the gate electrode G at a predetermined position, as illustrated in FIG. 2J.

Figure 2K:
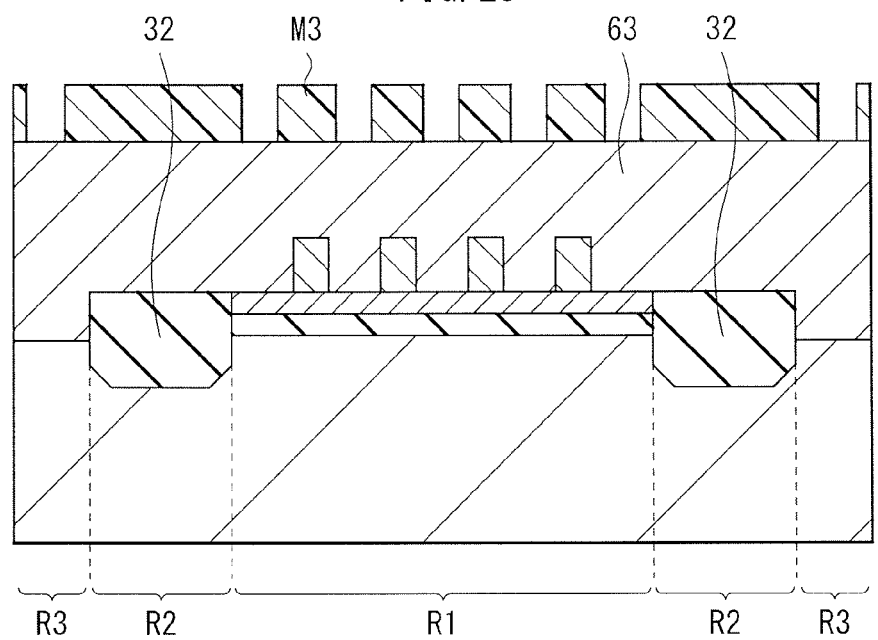
FIG. 2K is a cross-sectional diagram illustrating a process following the process in FIG. 2J.
Figure 2L:
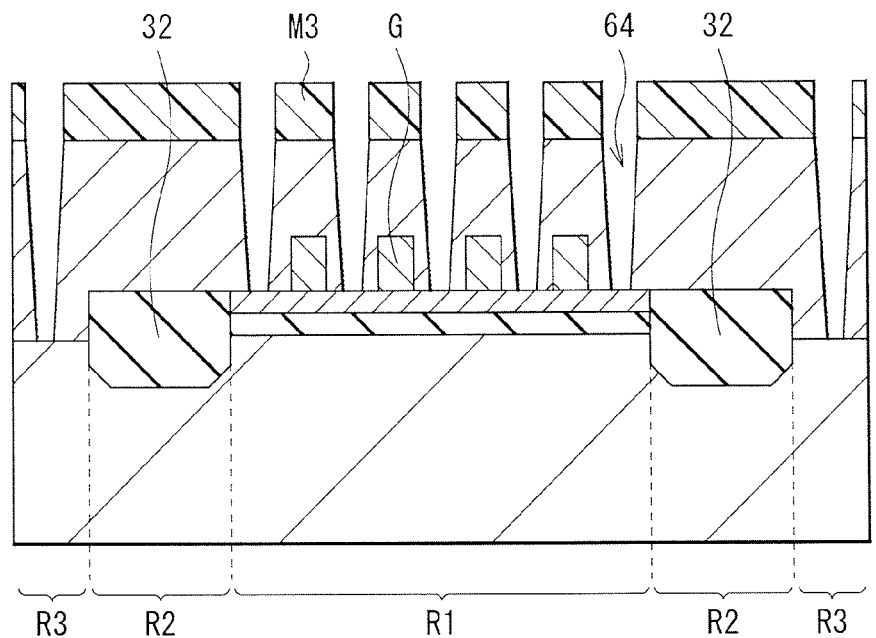
FIG. 2L is a cross-sectional diagram illustrating a process following the process in FIG. 2K.
Figure 2M:
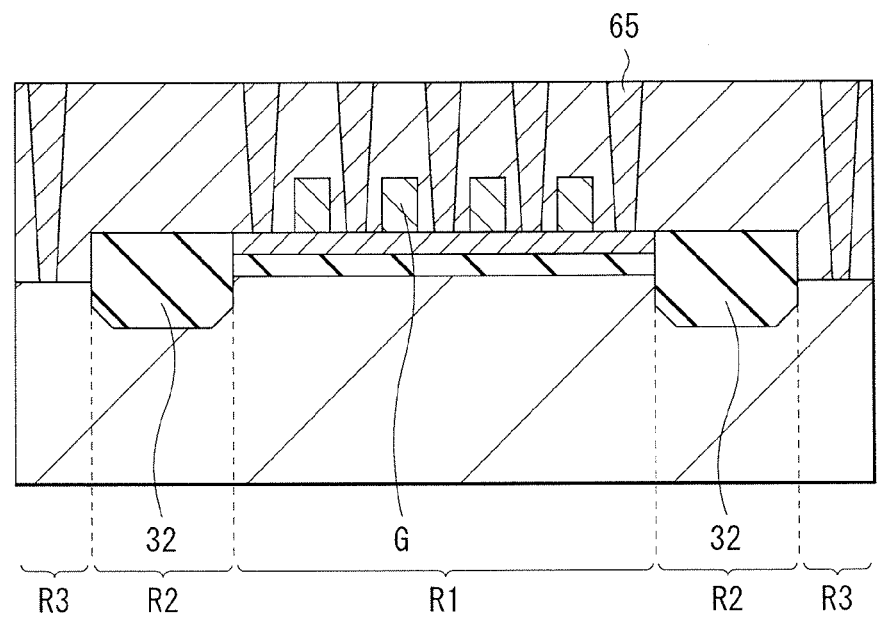
FIG. 2M is a cross-sectional diagram illustrating a process following the process in FIG. 2L.
Figure 2N:
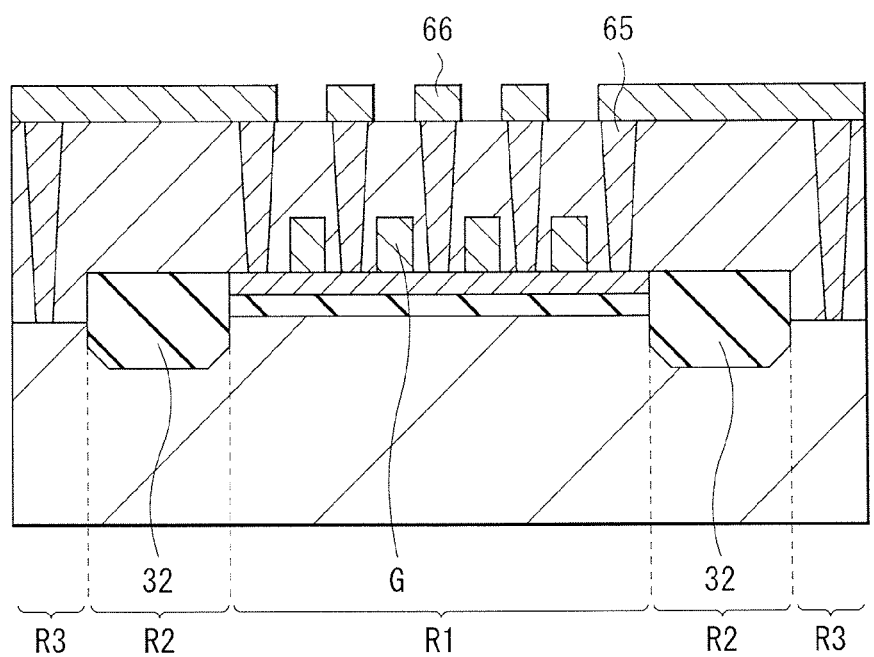
FIG. 2N is a cross-sectional diagram illustrating a process following the process in FIG. 2M.

Subsequently, an insulating layer 63 is formed to cover the whole, and then a photoresist mask M3 having an opening at a predetermined position is formed on the insulating layer 63 (FIG. 2K). The insulating layer 63 in a region not covered by the photoresist mask M3 is hollowed out to form a plurality of contact holes 64, and the contact holes 64 are then filled with a metal layer 65 (see FIGS. 2L and 2M). As a result, the source electrode S and the drain electrode D are formed. It is to be noted that, FIG. 2M illustrates a state in which the photoresist mask M3 is removed. Further, by a similar procedure, a metal layer 66 is formed at a predetermined position, to be in contact with an upper end of the metal layer 65 (see FIG. 2N). The metal layer 66 becomes the wiring layer 51, as well as the wiring patterns DD, SS, GG1, and GG2.

The semiconductor device 1 is thus completed.

[Functions and Effects of Semiconductor Device 1]

In the semiconductor device 1, during operation of the semiconductor element 10, heat generated, in particular, in the semiconductor layer 40 of the first MOSFET 11 is transported through the thermal conductive layer 50 to the substrate 20 in the bulk region R3 where thermal capacity is large. In other words, a heat dissipation path is secured sufficiently. This makes it possible to prevent the heat from being accumulated in the semiconductor layer 40 excessively. On the other hand, since the electric potential causing the second MOSFET 12 to be in the OFF state is applied to the gate electrode G of the second MOSFET 12, the second MOSFET 12 also serves as the interruption structure that interrupts a current. This interrupts the flow of the current between the first MOSFET 11 and the thermal conductive layer 50 and therefore, the electric potential of the substrate 20 is allowed to be set arbitrarily. For this reason, it is possible to achieve high-speed operation and power consumption reduction utilizing a so-called substrate bias effect. In other words, it is possible to increase an operating speed of the semiconductor element 10 by lowering a threshold voltage Vth by forward biasing the substrate 20 during operation, and to reduce a current leakage by back biasing the substrate 20 during standby.

The second MOSFET 12 is not utilized as a semiconductor integrated circuit, so to speak, a dummy structure. However, the second MOSFET 12 has substantially the same structure as that of the first MOSFET 11 and therefore, an additional process is not necessary in manufacturing the second MOSFET 12. It is to be noted that, usually, when a MOSFET for operation in a semiconductor integrated circuit is formed, dummy MOSFETs are formed on both sides of the MOSFET for operation, at the same time. One reason for this is as follows. For example, when a plurality of gate electrodes to be aligned on a substrate are formed by a photolithographic method, sizes and shapes of the gate electrodes located at both ends may be, in many cases, different from those of the gate electrode located at a position other than the both ends, due to characteristics of this manufacturing method. In other words, according to the present embodiment of the present technology, electrical interruption between the semiconductor layer 40 and the substrate 20 is performed utilizing the dummy MOSFET formed in such a manufacturing process and therefore, neither an increase in size nor complication of an overall configuration is caused, as compared with a typical case.

In this way, according to the present embodiment of the present technology, it is possible to provide the semiconductor device 1 superior in terms of heat dissipation and operating speed, in a simple configuration.

Modification of First Embodiment

[Configuration of Semiconductor Device 1A]

Figure 3A:
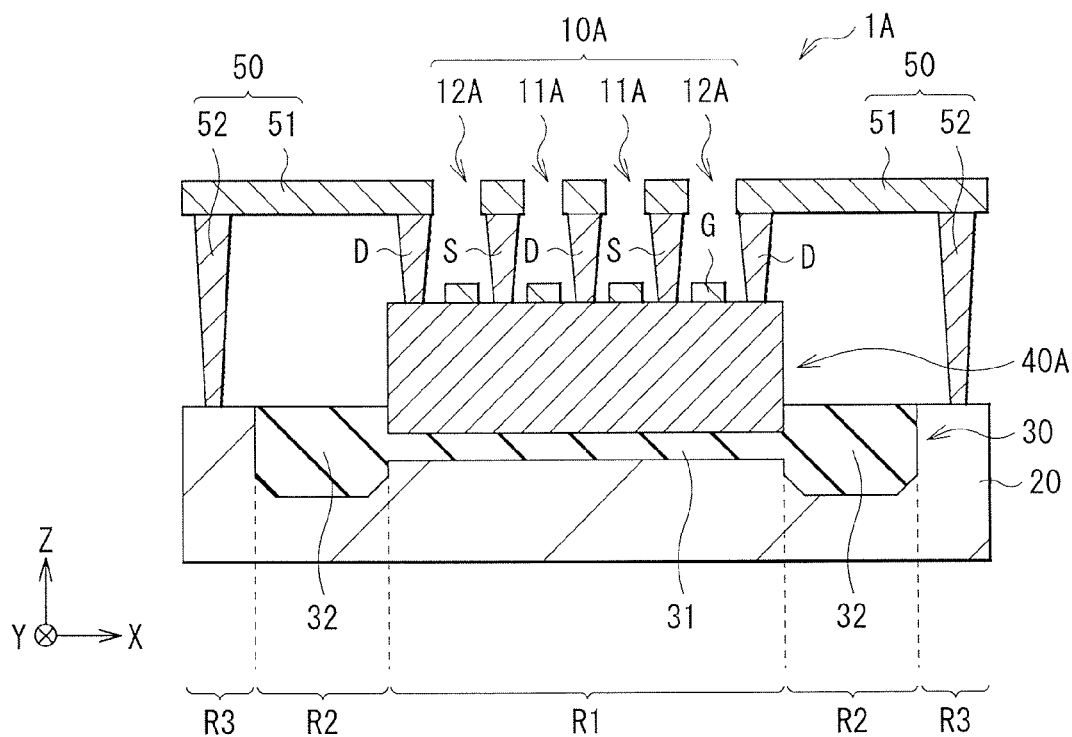
FIG. 3A is a cross-sectional diagram illustrating a semiconductor device that is a modification of the semiconductor device according to the first embodiment of the present disclosure.
Figure 3B:
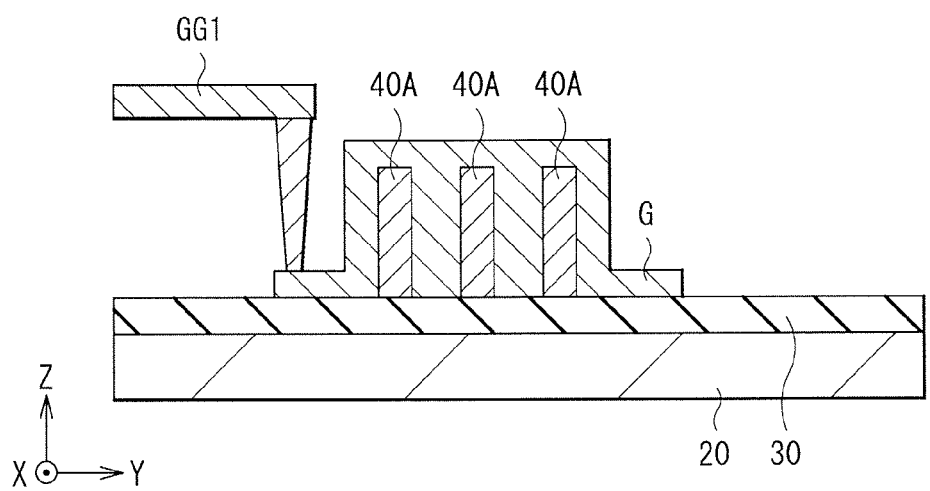
FIG. 3B is another cross-sectional diagram of the semiconductor device illustrated in FIG. 3A.

FIG. 3A illustrates a configuration of a cross section of a semiconductor device 1A serving as a modification of the semiconductor device 1 according to the above-described first embodiment. Further, FIG. 3B illustrates a configuration of a cross section of the semiconductor device 1A, the cross section being orthogonal to the cross section in FIG. 3A. The semiconductor device 1A has a configuration similar to that of the semiconductor device 1, except that a semiconductor element 10A having a first FinFET 11A and a second FinFET 12A is provided. Specifically, a plurality of semiconductor layers 40A each shaped like a fin are provided to stand on the insulator layer 30. For example, the plurality of semiconductor layers 40A may each extend in an X-axis direction, and align in a Y-axis direction. The gate electrode G extends to intersect the semiconductor layer 40A and to straddle the semiconductor layers 40A in the Y-axis direction. It is to be noted that, in FIGS. 3A and 3B, illustration of the channel region 40C, the drain region 40D, and the source region 40S are omitted. Drawings subsequent to FIGS. 3A and 3B are also omitted.

[Functions and Effects of Semiconductor Device 1A]

In this way, since the semiconductor layers 40A each shaped like a fin are provided, the semiconductor element 10A more highly integrated is achieved. On the other hand, a contact area between the semiconductor layer 40A and the insulator layer 30 is smaller than that of the semiconductor device 1. However, since the thermal conductive layer 50 is provided in a manner similar to the semiconductor device 1, it is possible to ensure high heat dissipation efficiency.

Second Embodiment

[Configuration of Semiconductor Device 2]

Figure 4A:
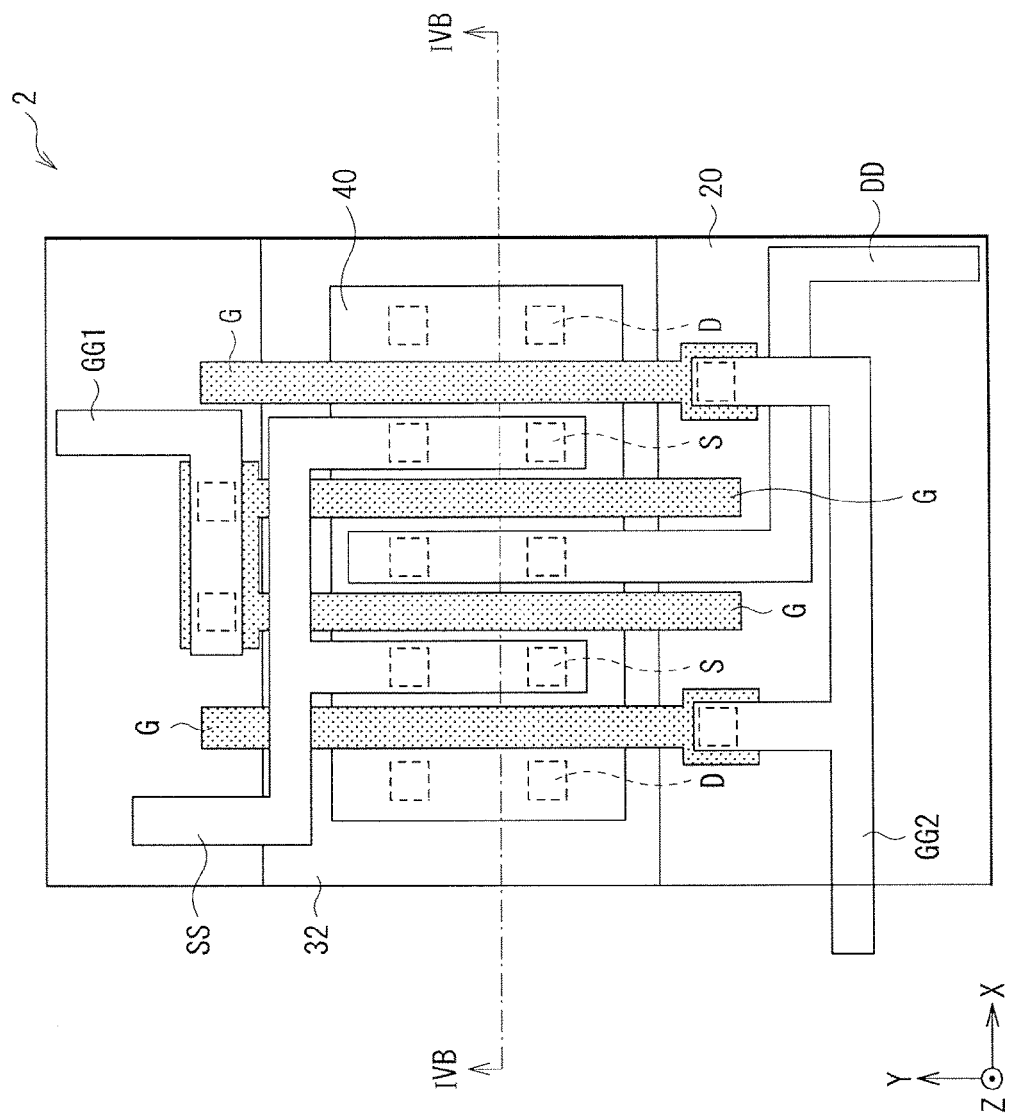
FIG. 4A is a plan view illustrating a configuration example of a semiconductor device according to a second embodiment of the present disclosure.
Figure 4B:
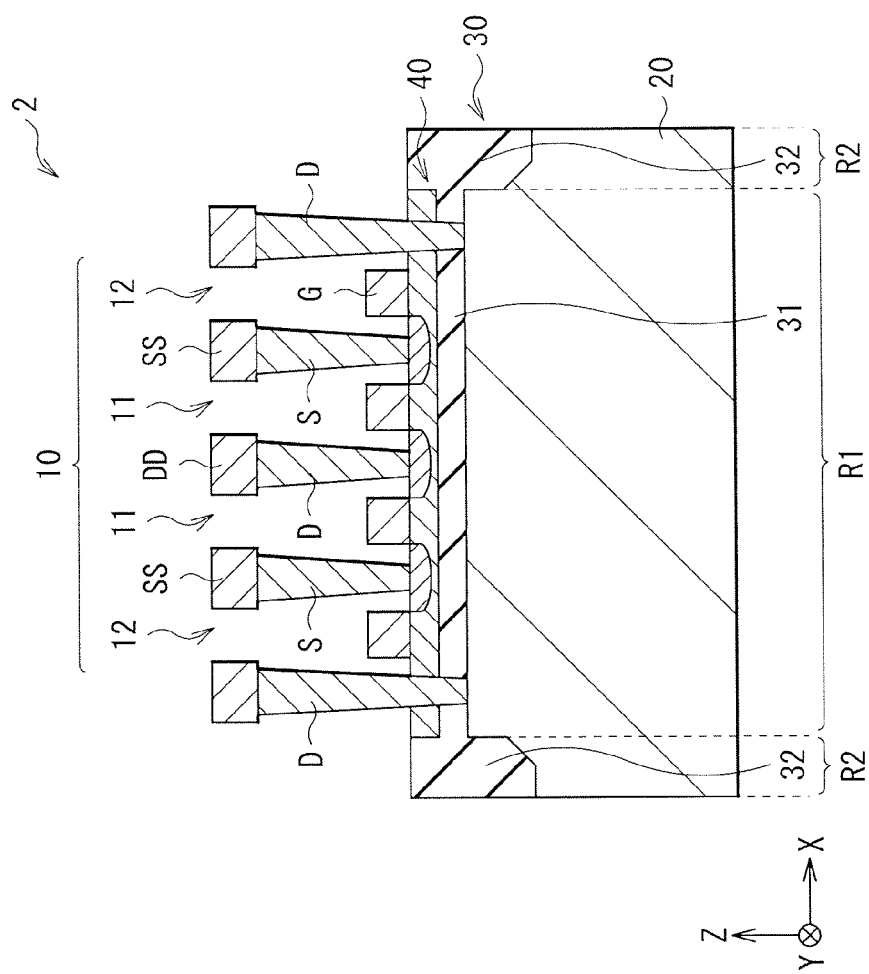
FIG. 4B is a cross-sectional diagram of the semiconductor device illustrated in FIG. 4A.

FIG. 4A illustrates a plane configuration of a semiconductor device 2 according to a second embodiment of the present disclosure. FIG. 4B illustrates a cross-sectional configuration of the semiconductor device 2. FIG. 4B corresponds to a cross-sectional diagram taken along a cutting plane line IVB-IVB illustrated in FIG. 4A, and viewed in an arrow direction.

In the semiconductor device 2, in the element formation region R1, the drain electrode D of each of the second MOSFETs 12 located at both ends passes through the insulator layer 30, to link the semiconductor layer 40 and the substrate 20. Except this point, the semiconductor device 2 has a configuration similar to that of the semiconductor device 1 of the above-described first embodiment.

[Functions and Effects of Semiconductor Device 2]

The semiconductor device 2 described above is capable of exhibiting functions similar to those of the semiconductor device 1 of the above-described first embodiment. Further, it is possible to achieve a more compact configuration, because the wiring layer 51 and the plug 52 are unnecessary, as compared with the semiconductor device 1.

Modification of Second Embodiment

[Configuration of Semiconductor Device 2A]

Figure 5A:
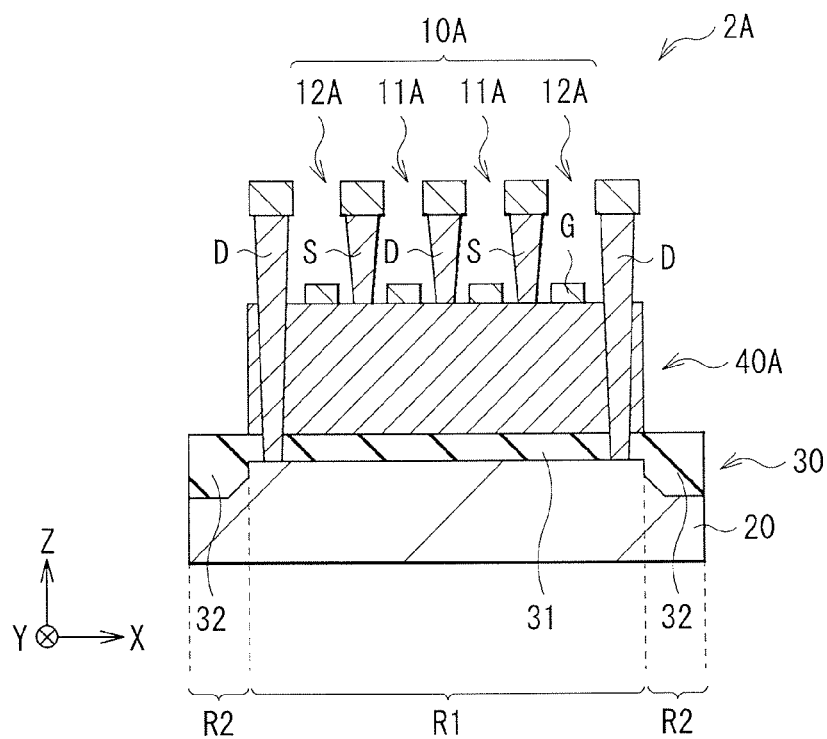
FIG. 5A is a cross-sectional diagram illustrating a semiconductor device that is a modification of the semiconductor device according to the second embodiment of the present disclosure.
Figure 5B:
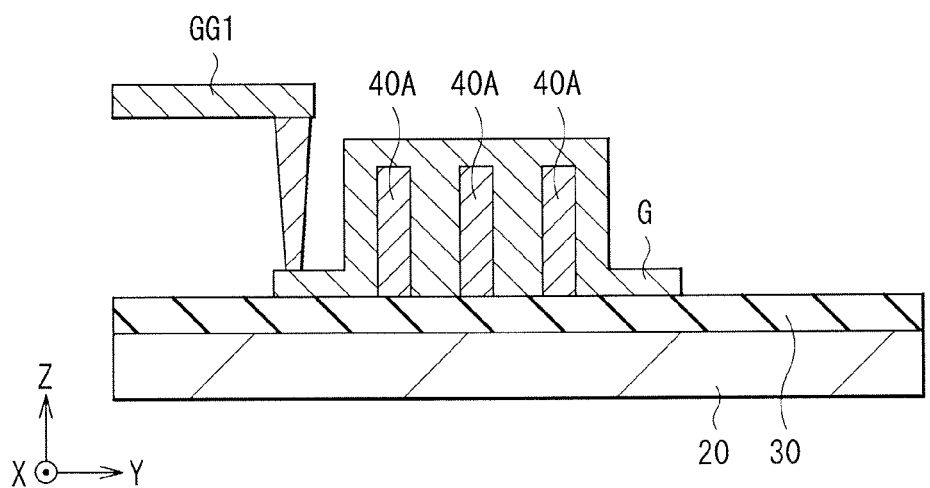
FIG. 5B is another cross-sectional diagram of the semiconductor device illustrated in FIG. 5A.

FIG. 5A illustrates a configuration of a cross section of a semiconductor device 2A serving as a modification of the semiconductor device 2 according to the above-described second embodiment. Further, FIG. 5B illustrates a configuration of a cross section of the semiconductor device 2A, the cross section being orthogonal to the cross section in FIG. 5A. The semiconductor device 2A has a configuration similar to that of the semiconductor device 2, except that a semiconductor element 10A having the first FinFET 11A and the second FinFET 12A is provided. Specifically, the plurality of semiconductor layers 40A each shaped like a fin are provided to stand on the insulator layer 30. For example, the plurality of semiconductor layers 40A may each extend in an X-axis direction, and align in a Y-axis direction. The gate electrode G extends to intersect the semiconductor layer 40A and to straddle the semiconductor layers 40A in the Y-axis direction.

[Functions and Effects of Semiconductor Device 2A]

In this way, since the semiconductor layers 40A each shaped like a fin are provided, the semiconductor element 10A more highly integrated is achieved. On the other hand, a contact area between the semiconductor layer 40A and the insulator layer 30 is smaller than that of the semiconductor device 2. However, since the drain electrode D in the second FinFET 12A is connected to the substrate 20 by passing through the insulator layer 30, it is possible to ensure high heat dissipation efficiency.

Third Embodiment

[Configuration of Semiconductor Device 3]

Figure 6A:
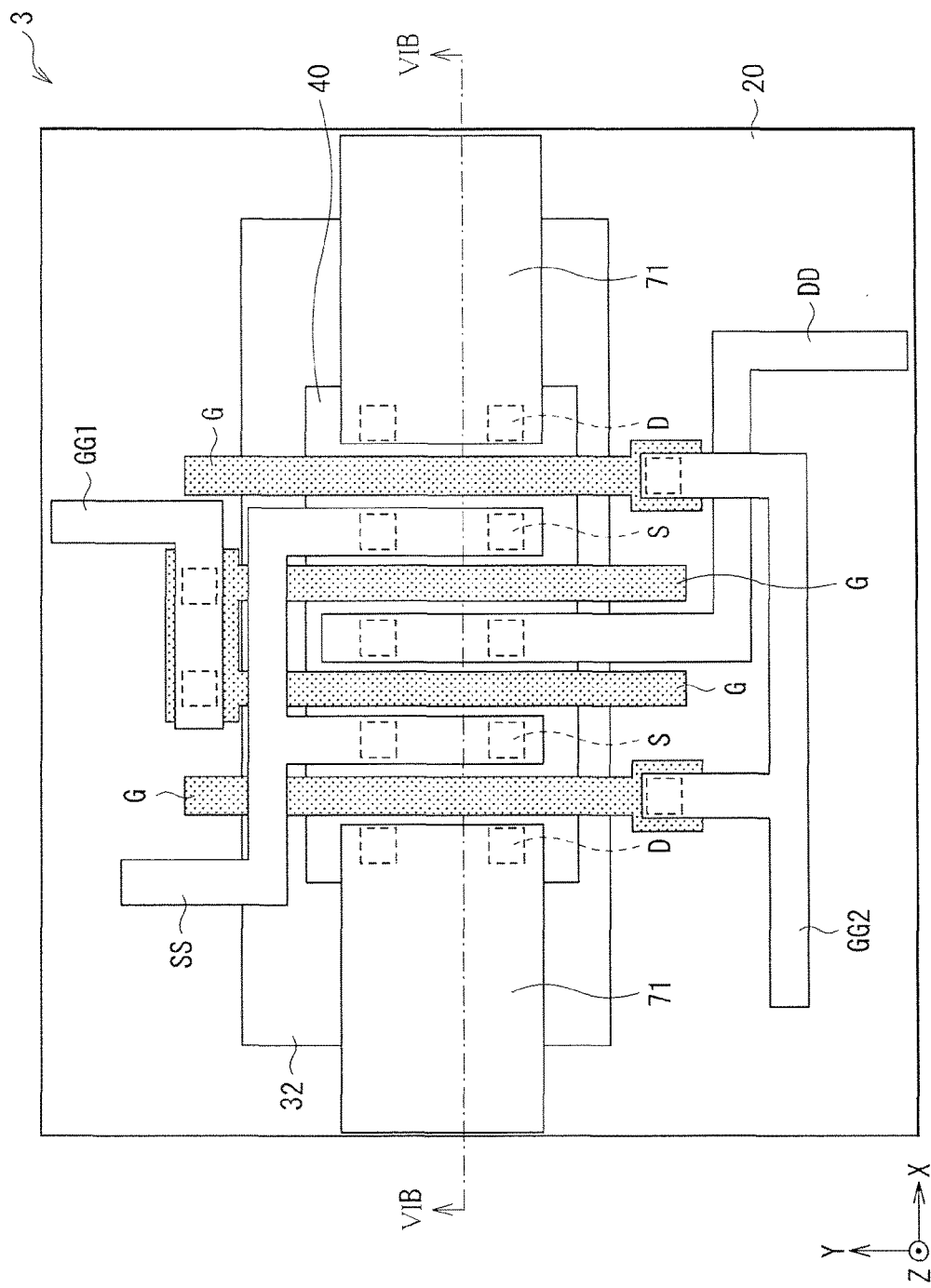
FIG. 6A is a plan view illustrating a configuration example of a semiconductor device according to a third embodiment of the present disclosure.
Figure 6B:
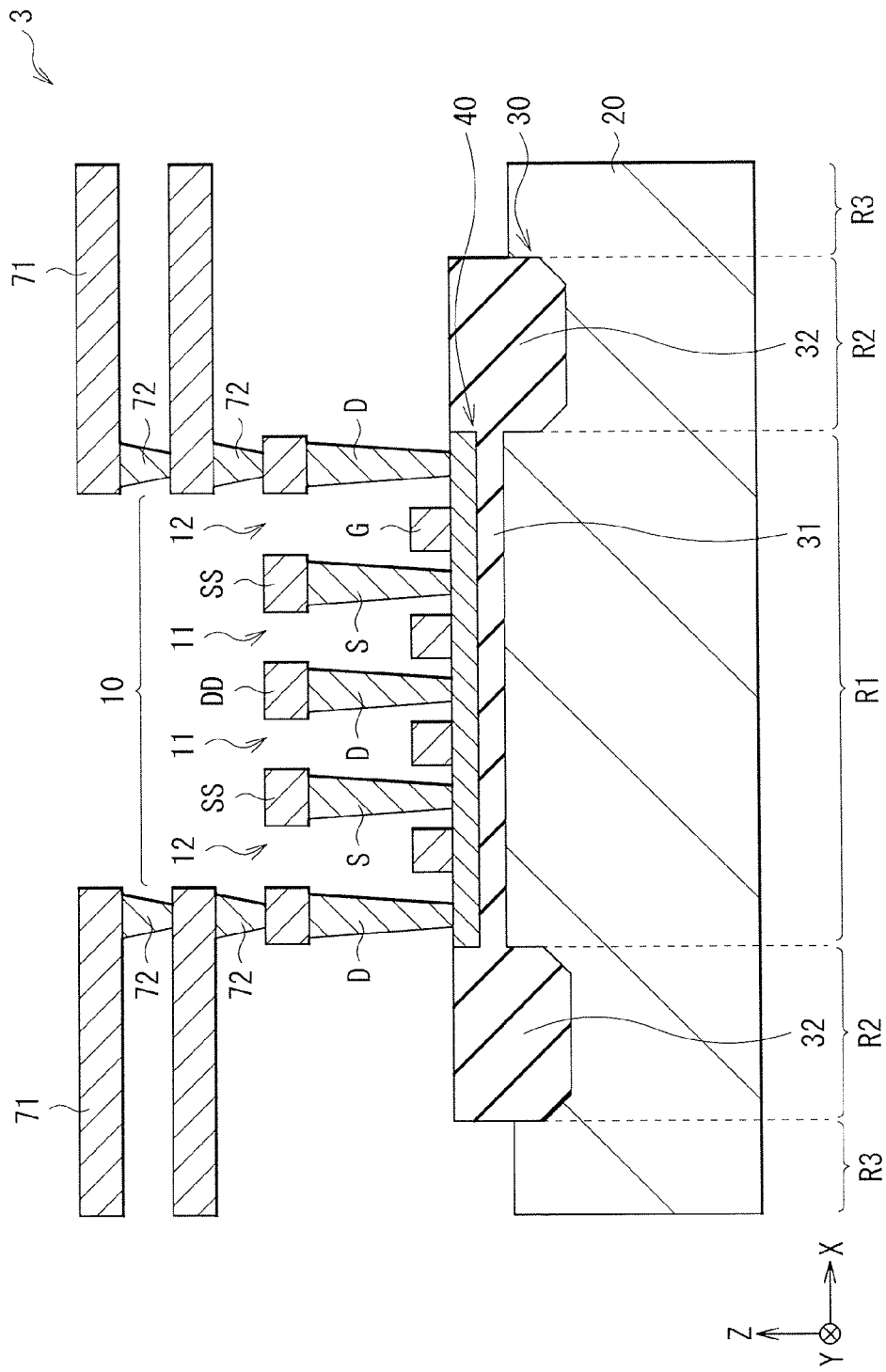
FIG. 6B is a cross-sectional diagram of the semiconductor device illustrated in FIG. 6A.

FIG. 6A illustrates a plane configuration of a semiconductor device 3 according to a third embodiment of the present disclosure. FIG. 6B illustrates a cross-sectional configuration of the semiconductor device 3. FIG. 6B corresponds to a cross-sectional diagram taken along a cutting plane line VIB-VIB illustrated in FIG. 6A, and viewed in an arrow direction.

The semiconductor device 3 has a configuration similar to that of the semiconductor device 1 of the above-described first embodiment, except that a metal layer 71 serving as a heat dissipation layer is provided, in place of the thermal conductive layer 50. Specifically, the drain electrode D of the second MOSFET 12 is connected to the metal layer 71 through a plug 72, instead of being connected to the substrate 20 by the thermal conductive layer 50. As a result, a path of releasing heat of the semiconductor layer 40 is secured. It is to be noted that the numbers and the placement position of the metal layers 71 are not limited to those illustrated in FIG. 6B.

[Functions and Effects of Semiconductor Device 3]

The semiconductor device 3 described above is also capable of exhibiting functions similar to those of the semiconductor device 1 of the above-described first embodiment.

Modification of Third Embodiment

[Configuration of Semiconductor Device 3A]

Figure 7A:
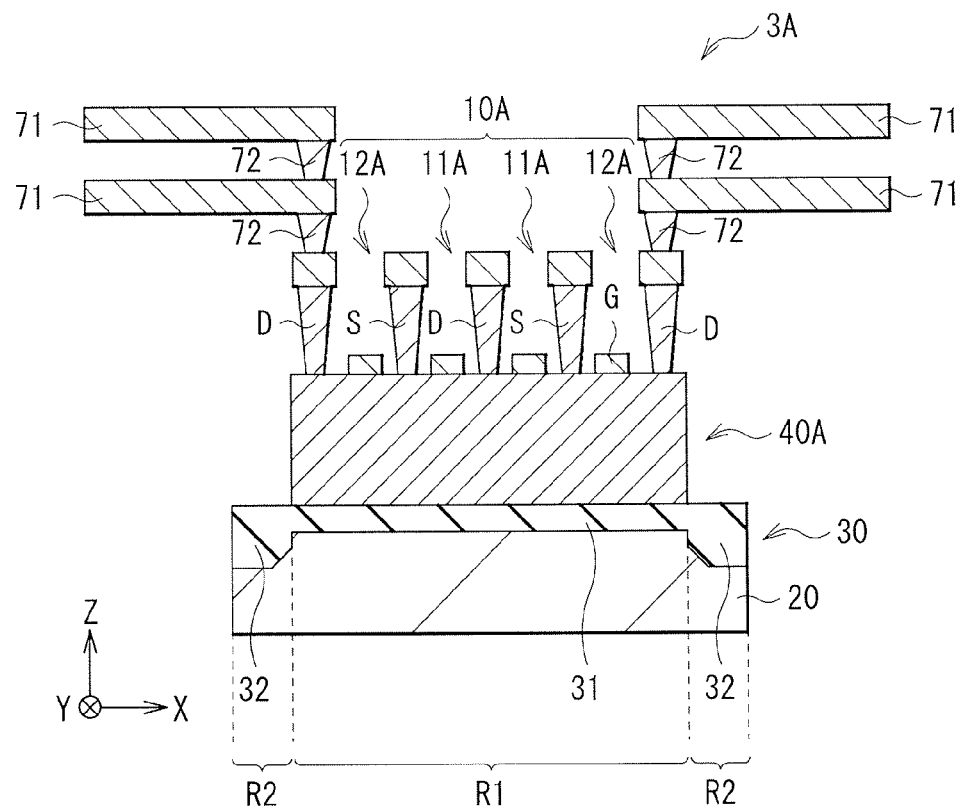
FIG. 7A is a cross-sectional diagram illustrating a semiconductor device that is a modification of the semiconductor device according to the third embodiment of the present disclosure.
Figure 7B:
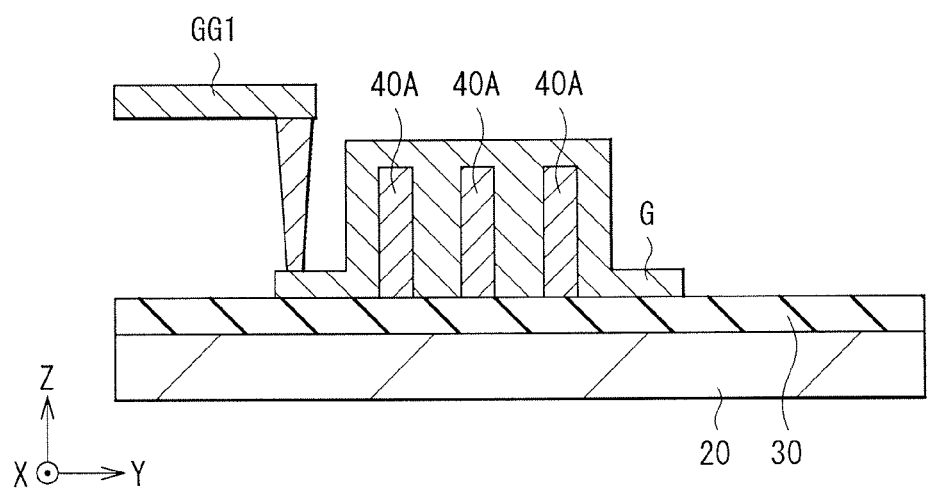
FIG. 7B is another cross-sectional diagram of the semiconductor device illustrated in FIG. 7A.

FIG. 7A illustrates a configuration of a cross section of a semiconductor device 3A serving as a modification of the semiconductor device 3 according to the above-described third embodiment. Further, FIG. 7B illustrates a configuration of a cross section of the semiconductor device 3A, the cross section being orthogonal to the cross section of FIG. 7A. The semiconductor device 3A has a configuration similar to that of the semiconductor device 2, except that the semiconductor element 10A having the first FinFET 11A and the second FinFET 12A is provided. Specifically, the plurality of semiconductor layers 40A each shaped like a fin are provided to stand on the insulator layer 30. For example, the plurality of semiconductor layers 40A may each extend in an X-axis direction, and align in a Y-axis direction. The gate electrode G extends to intersect the semiconductor layer 40A and to straddle the semiconductor layers 40A in the Y-axis direction.

[Functions and Effects of Semiconductor Device 3A]

In this way, since the semiconductor layers 40A each shaped like a fin are provided, the semiconductor element 10A more highly integrated is achieved. On the other hand, the contact area between the semiconductor layer 40A and the insulator layer 30 is smaller than that of the semiconductor device 2. However, since the drain electrode D in the second FinFET 12A is connected to the metal layer 71 through the plug 72, it is possible to ensure high heat dissipation efficiency.

Fourth Embodiment

[Configuration of Semiconductor Device 4]

Figure 8:
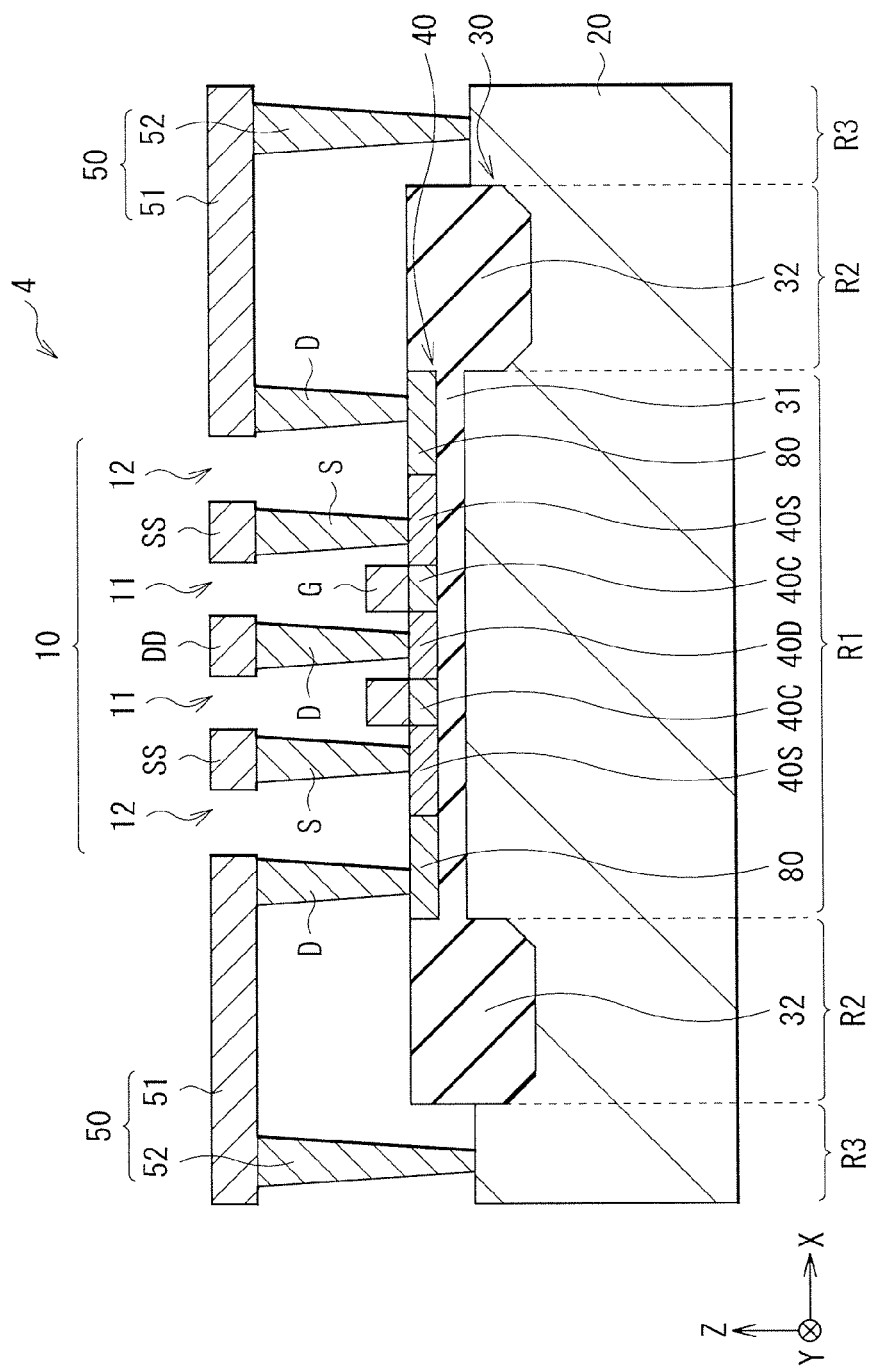
FIG. 8 is a cross-sectional diagram illustrating a configuration example of a semiconductor device according to a fourth embodiment of the present disclosure.

FIG. 8 illustrates a cross-sectional configuration of a semiconductor device 4 according to a fourth embodiment of the present disclosure.

In the semiconductor device 4, in the semiconductor layer 40, an impurity region 80 of a conduction type, which is different from the conduction type of each of the drain region 40D and the drain region 40D of the first MOSFET 11, is provided at each of both ends between which the first MOSFETs 11 are provided. In other words, the semiconductor device 4 includes the impurity region 80 as an interruption structure that interrupts a flow of a current between the first MOSFET 11 and the thermal conductive layer 50, in place of the second MOSFET 12. For example, when the drain region 40D and the source region 40S are of an n-type, the impurity region 80 is of a p-type. However, in the semiconductor device 4, the drain region 40D and the source region 40S as well as the impurity region 80 occupy the whole in the thickness direction of the semiconductor layer 40 (from the top surface to an undersurface). Except this point, the semiconductor device 4 has a configuration similar to that of the semiconductor device 1 of the above-described first embodiment.

[Functions and Effects of Semiconductor Device 4]

The semiconductor device 4 described above is also capable of exhibiting functions similar to those of the semiconductor device 1 of the above-described first embodiment. In other words, an electric potential of the impurity region 80 does not affect the channel region 40C of the first MOSFET 11. This interrupts the flow of a current between the first MOSFET 11 and the thermal conductive layer 50 and therefore, the electric potential of the substrate 20 is allowed to be set arbitrarily. Hence, it is possible to achieve high-speed operation and power consumption reduction utilizing a so-called substrate bias effect. Moreover, unlike the semiconductor device 1 of the above-described first embodiment, it is not necessary to apply an electric potential to the gate electrode G in the second MOSFET 12.

As described above, the present technology has been described with reference to some embodiments and modifications thereof, but is not limited thereto and may be variously modified. For example, the conduction types of the drain region 40D and the source region 40S in the above-described embodiments may be limited to neither the p-type nor the n-type. Moreover, as for the cross-sectional configuration and the plane configuration of the semiconductor device, as well as the method of manufacturing the semiconductor device in any of the above-described embodiments and the like, these are not limited to those described above and may be modified as appropriate.

In addition, the above-described fourth embodiment is achieved by replacing the second MOSFET 12 in the semiconductor device 1 of the first embodiment, with the impurity region 80, but the other embodiments as well as the modifications thereof may have similar configurations. In other words, the second MOSFET 12 (12A) in any of the semiconductor devices 1A, 2, 2A, 3, and 3A may be replaced with the impurity region 80.

Moreover, in the above-described embodiments and the like, the configuration, in which a first transistor (the first MOSFET 11) is provided between a pair of second transistors (the second MOSFETs 12) in an in-plane direction, has been described as an example, but the present technology is limited to thereto. In an embodiment of the present technology, only one of the second transistors may be provided. However, the configuration in which the first transistor is provided between the pair of second transistors may be more preferable, in view of heat dissipation efficiency and considering patterning accuracy in the photolithographic method.

It is possible to achieve at least the following configurations from the above-described example embodiments of the disclosure.

(1) A semiconductor device including:
  a substrate;
  an insulator layer provided on the substrate;
  a first transistor provided on the insulator layer;
  a semiconductor layer including a plurality of impurity regions of a first conduction type, the impurity regions forming a part of the first transistor;
  a heat dissipation layer;
  a thermal conductive layer linking the semiconductor layer and the heat dissipation layer; and
  an interruption structure configured to interrupt a flow of a current between the first transistor and the thermal conductive layer.

(2) The semiconductor device according to (1), further including a second transistor provided on the insulator layer, as the interruption structure,
  wherein the impurity region of the first conduction type also forms a part of the second transistor, and
  the thermal conductive layer links the impurity region of the first conduction type in the second transistor, with the heat dissipation layer.

(3) The semiconductor device according to (2), wherein the first transistor is provided between a pair of second transistors each equivalent to the second transistor, in an in-plane direction.

(4) The semiconductor device according to (2) or (3), wherein
  a plurality of first transistors each equivalent to the first transistor are arranged in a first direction, and
  a pair of second transistors each equivalent to the second transistor are disposed at both ends with the plurality of first transistors interposed therebetween, in the first direction.

(5) The semiconductor device according to (4), wherein
  the first transistor and the second transistor each include a source electrode, a drain electrode, and a gate electrode, the source electrode and the drain electrode each being connected to the impurity region of the first conduction type, the gate electrode being provided in a channel region with a gate insulating film interposed therebetween, and the channel region being provided between the plurality of impurity regions of the first conduction type, and
  the thermal conductive layer is connected to the source electrode or the drain electrode in the second transistor.

(6) The semiconductor device according to (5), wherein an electric potential causing the second transistor to be in an OFF state is applied to the gate electrode in the second transistor.

(7) The semiconductor device according to any one of (1) to (6), wherein
  the substrate also serves as the heat dissipation layer, and
  the thermal conductive layer is connected to the substrate, in a region except a region in which the substrate and the semiconductor layer overlap each other.

(8) The semiconductor device according to any one of (1) to (6), wherein
  the substrate also serves as the heat dissipation layer, and
  the thermal conductive layer links the semiconductor layer and the substrate, by passing through the insulator layer.

(9) The semiconductor device according to any one of (1) to (6), wherein one or more metal layers are provided as the heat dissipation layer.

(10) The semiconductor device according to (1), wherein
  the semiconductor layer includes an impurity region of a second conduction type, as the interruption structure, and
  the thermal conductive layer links the impurity region of the second conduction type, with the heat dissipation layer.

(11) The semiconductor device according to (10), wherein the first transistor is provided between a pair of impurity regions each equivalent to the impurity region of the second conduction type, in an in-plane direction.

It should be understood by those skilled in the art that various modifications, combinations, sub-combinations, and alterations may occur depending on design requirements and other factors insofar as they are within the scope of the appended claims or the equivalents thereof.

What is claimed is:

1. A semiconductor device comprising:
  a bulk substrate having an upper surface;
  an insulator layer directly on a portion but not all of the upper surface of the bulk substrate so as to leave a bulk region uncovered by the insulator layer, the bulk region being outside of a periphery of the insulator layer, the insulator layer having an element separation region received within a recess in the upper surface, the element separation region surrounding an element formation region of the semiconductor device and laterally separating and isolating the element formation region of the semiconductor device from the bulk region along the upper surface;
  a semiconductor layer on the insulator layer and within the element formation region;
  a first transistor on the semiconductor layer, the first transistor including a gate and first source and drain regions in the semiconductor layer, the first source and drain regions each being of a first conductivity type;
  a thermally conductive path linking the semiconductor layer and the bulk region, the thermally conductive path including a thermally conductive layer; and
  an interruption structure adjacent to and in series with the first transistor, not isolated from the first transistor along the semiconductor layer, and configured and connected to selectively interrupt a flow of a current between the first transistor and the thermally conductive path, the thermally conductive path bridging over the recess and overlapping the periphery of the insulator layer.

2. The semiconductor device according to claim 1, further comprising a second transistor on the semiconductor layer, wherein:
  the second transistor is the interruption structure,
  the second transistor includes a second gate and second source and drain regions in the semiconductor layer, the second source and drain regions each being of the first conductivity type, and
  the thermally conductive layer links the second source region or second drain region of the second transistor with the bulk region.

3. The semiconductor device according to claim 1, comprising two second transistors, the first transistor being between the two second transistors in an in-plane direction, one of the two second transistors being the interruption structure.

4. The semiconductor device according to claim 1, comprising a plurality of the first transistors and two second transistors, wherein:
  the plurality of the first transistors are arranged along a first direction,
  the plurality of the first transistors are between the two second transistors along the first direction,
  one of the two second transistors is the interruption structure.

5. The semiconductor device according to claim 4, wherein the thermally conductive layer is connected to a source electrode or a drain electrode of the one of the two second transistors.

6. The semiconductor device according to claim 5, wherein application of an electric potential to a gate of the one of the two second transistors causes the one of the two second transistors to be in an OFF state.

7. The semiconductor device according to claim 1, wherein:
the semiconductor layer includes an impurity region of a second conductivity type which is different than the first conductivity type, as the interruption structure, and
the thermally conductive layer links the impurity region of the second conduction type, with the bulk region.

8. The semiconductor device according to claim 7 comprising two of the impurity regions, wherein the first transistor is provided between the two impurity regions in an in-plane direction.

9. A semiconductor device comprising:
a bulk substrate having an upper surface;
an insulator layer directly on a portion but not all of the upper surface so as to leave a bulk region uncovered by the insulator layer, the bulk region being outside of a periphery of the insulator layer, the insulator layer having an element separation region received within a recess in the upper surface, the element separation region surrounding an element formation region of the semiconductor device laterally separating and isolating the element formation region of the semiconductor device from the bulk region along the upper surface;
a thin film semiconductor layer on the insulator layer and within the element formation region;
a first MOSFET on the thin film semiconductor layer with source/drain regions in the thin film semiconductor layer;
a second MOSFET on the thin film semiconductor with source/drain regions in the thin film semiconductor layer, the first and second MOSFETs sharing in common one of the source/drain regions; and
a thermally conductive path linking the thin film semiconductor layer and the bulk region, with the second MOSFET between the thermally conductive path and the first MOSFET, the thermally conductive path including a thermally conductive layer, the thermally conductive path bridging over the recess and overlapping the periphery of the insulator layer.

10. The semiconductor device of claim 9, wherein the first and second MOSFETs are finFETs.

11. The semiconductor device of claim 9, comprising a plurality of the first MOSFETs and two of the second MOSFETs, wherein the plurality of the first MOSFETs are arranged in series between the two second MOSFETs.

* * * * *